(12) United States Patent
Weber et al.

(10) Patent No.: US 8,999,516 B2
(45) Date of Patent: Apr. 7, 2015

(54) POLYCRYSTALLINE SILICON ROD AND PROCESS FOR PRODUCTION THEREOF

(71) Applicant: Wacker Chemie AG, Munich (DE)

(72) Inventors: Martin Weber, Kastl (DE); Erich Dornberger, Burghausen (DE); Michael Kerscher, Burgkirchen (DE); Heinz Kraus, Zeilarn (DE); Reiner Pech, Neuoetting (DE)

(73) Assignee: Wacker Chemie AG, Munich (DE)

( * ) Notice: Subject to any disclaimer, the term of this patent is extended or adjusted under 35 U.S.C. 154(b) by 196 days.

(21) Appl. No.: 13/886,439

(22) Filed: May 3, 2013

(65) Prior Publication Data

US 2013/0295408 A1    Nov. 7, 2013

(30) Foreign Application Priority Data

May 7, 2012   (DE) .......................... 10 2012 207 513

(51) Int. Cl.
| | |
|---|---|
| *B32B 5/18* | (2006.01) |
| *B32B 9/04* | (2006.01) |
| *B32B 13/04* | (2006.01) |
| *C01B 33/02* | (2006.01) |
| *C23C 16/24* | (2006.01) |
| *C01B 33/035* | (2006.01) |
| *C23C 16/44* | (2006.01) |

(52) U.S. Cl.
CPC ......... *C01B 33/02* (2013.01); *Y10T 428/12479* (2015.01); *C23C 16/24* (2013.01); *C01B 33/035* (2013.01); *C23C 16/4418* (2013.01)

(58) Field of Classification Search
CPC ...... C01B 33/02; C01B 33/035; C23C 16/24; C23C 16/4418; Y10T 428/12479
USPC ................................... 428/613, 446
See application file for complete search history.

(56) References Cited

U.S. PATENT DOCUMENTS

| | | | |
|---|---|---|---|
| 6,309,467 B1 | 10/2001 | Wochner et al. | |
| 6,350,313 B2 | 2/2002 | Kraus et al. | |
| 7,939,173 B2 * | 5/2011 | Sofin et al. | ..................... 428/446 |
| 8,074,905 B2 | 12/2011 | Schaefer et al. | |
| 2003/0021894 A1 | 1/2003 | Inoue et al. | |
| 2003/0150378 A1 | 8/2003 | Winterton et al. | |
| 2010/0219380 A1 | 9/2010 | Hertlein et al. | |
| 2012/0052297 A1 | 3/2012 | Pech et al. | |

FOREIGN PATENT DOCUMENTS

| | | | |
|---|---|---|---|
| CN | 102383194 A | 3/2012 | |
| EP | 0905796 B1 | 4/2002 | |
| EP | 2423163 A1 | 2/2012 | |
| JP | 11-043317 * | 2/1999 | .............. C01B 33/02 |

OTHER PUBLICATIONS

Machine English Translation of Haruyuki (JP 11-043317) retrieved from the JPO website on Feb. 6, 2015.*

* cited by examiner

*Primary Examiner* — Jonathan Langman
(74) *Attorney, Agent, or Firm* — Caesar, Rivise, Bernstein, Cohen & Pokotilow, Ltd.

(57) ABSTRACT

The invention provides a polycrystalline silicon rod having a total diameter of at least 150 mm, including a core A having a porosity of 0 to less than 0.01 around a thin rod, and at least two subsequent regions B and C which differ in porosity by a factor of 1.7 to 23, the outer region C being less porous than region B.

8 Claims, 1 Drawing Sheet

POLYCRYSTALLINE SILICON ROD AND PROCESS FOR PRODUCTION THEREOF

BACKGROUND OF THE INVENTION

The invention relates to a polycrystalline silicon rod and to a process for production of a polycrystalline silicon rod.

Polycrystalline silicon (polysilicon for short) serves as a starting material for production of monocrystalline silicon for semiconductors by the Czochralski (CZ) or zone-melting (FZ) processes, and for production of mono- or polycrystalline silicon by various drawing and casting processes for production of solar cells for photovoltaics.

Polycrystalline silicon is generally produced by means of the Siemens process.

In this process, in a bell-shaped reactor ("Siemens reactor"), support bodies, typically thin filament rods (thin rods) of silicon, are heated by a direct passage of current, and a reaction gas comprising hydrogen and one or more silicon-containing components is introduced.

Typically, the silicon-containing component used is trichlorosilane ($SiHCl_3$, TCS) or a mixture of trichlorosilane with dichlorosilane ($SiH_2Cl_2$, DCS) and/or with tetrachlorosilane ($SiCl_4$, STC). The use of monosilane ($SiH_4$) is also known.

The thin rods are typically inserted vertically into electrodes present at the reactor base, through which they are connected to the power supply. Every two thin rods are coupled via a horizontal bridge (likewise made from silicon) and form a support body for the silicon deposition. The bridge coupling produces the typical U shape of the support bodies.

High-purity polysilicon is deposited on the heated thin rods and the horizontal bridge, as a result of which the diameter thereof grows with time.

The deposition process is typically controlled by the setting of rod temperature and reaction gas flow rate and composition.

The rod temperature is measured with radiation pyrometers, usually on the surfaces of the rods facing the reactor wall.

The rod temperature is set by control or regulation of the electrical power, either in a fixed manner or as a function of the rod diameter.

The amount and composition of the reaction gas are set as a function of the time or rod diameter.

After a desired diameter has been attained, the deposition is ended and the polysilicon rods which have formed are cooled to room temperature.

The morphology of the growing rod is determined by the parameters of the deposition process.

The morphology of the deposited rods may vary from compact and smooth up to very porous and fissured material.

U.S. Pat. No. 6,350,313 B2 discloses the further processing of compact polycrystalline silicon rods.

Compact polycrystalline silicon is very substantially free of cracks, pores, gaps, fissures etc.

The apparent density of such a material corresponds to the true density of polycrystalline silicon and is 2.329 $g/cm^3$.

US 2003/0150378 A2 discloses "teardrop poly" and a process for production thereof. In this process, a compact, hole-free, high-purity polysilicon rod is deposited from monosilane $SiH_4$ by means of the Siemens process up to a silicon rod diameter of 45 mm at 850° C. and a silane concentration of 1.14 mol %. Subsequently, the rod surface temperature is increased instantly from 850 to 988° C. and the silane concentration reduced instantly from 1.14 to 0.15 mol %. This parameter jump instantly alters the growth of the silicon crystals on the silicon rod, and needles, called dendrites, grow out of the rod surface. These dendrites can subsequently be removed from the compact rod part, while the compact part has to be processed further separately.

US 2010/219380 A1, in contrast, discloses a polycrystalline silicon rod having an apparent density in the range from 2.0 to 2.3 $g/cm^3$ and an overall porosity of 0.01 to 0.2. The silicon rod has a similar structure, though this structure contains pores, gaps, crevices, cracks and fissures. Such a polycrystalline silicon rod can be comminuted into chunks with comparatively low energy expenditure, and accordingly leads to less surface contamination at the surface of the chunks.

US 2010/219380 A1 likewise discloses a process for producing a polysilicon rod as claimed in any of claims 1 to 3, in which a stream of a reaction gas comprising a chlorosilane mixture and hydrogen is introduced into a reactor and high-purity polysilicon is deposited on a filament rod of silicon heated by direct passage of current, the filament rod being formed from two vertical rods and one horizontal rod, and the horizontal rod forming a linking bridge between the vertical rods, characterized in that the chlorosilane mixture used is a mixture of di- and trichlorosilane and the passage of current through the filament rod is regulated such that the filament rod has a temperature at the underside of the bridge between 1300 and 1413° C. and the temperature of the reaction gases in the reactor is measured and adjusted so as not to be more than 650° C., and the flow rate of the chlorosilane mixture is adjusted to its maximum value within less than 30 hours, preferably within less than 5 hours, from the start of supply of the chlorosilane mixture.

The compact rods are more expensive to produce. The deposition process is slower. However, compact rods generally lead to better yields in subsequent crystallization steps.

The increase in the base parameters of rod temperature, specific flow rate, silane concentration generally leads to an increase in the deposition rate and hence to an improvement in the economic viability of the deposition process.

However, natural limits are set on each of these parameters, the exceedance of which disrupts the production process.

If, for example, the concentration of the silicon-containing component selected is too high, there may be homogeneous gas phase deposition.

The effect of an excessively high rod temperature may be that the morphology of the silicon rods to be deposited is not compact enough to provide a sufficient cross-sectional area to the current flow, which rises with the growing rod diameter. If the current density becomes too high, this can cause the melting of silicon. From a certain diameter of about 120 mm, even in the case of compact morphology, silicon in the rod interior can become liquid, since high temperature differences exist between surface and rod center.

This is also problematic in the process according to US 2003/0150378 A2, since the current flows exclusively through the compact part of the silicon rod. If the diameter of the compact part selected is too low, which is actually desirable since the aim of the process is the production of dendrites, there is a risk of melting. With rising diameter, higher currents are required, and so the diameter of the compact part must also increase. This reduces the yield of dendrites.

In the case of a polycrystalline silicon rod according to US 2010/219380 A1, in contrast, a majority of the rod cross section is available for current flow. The electrical conductivity is not impaired by the small cracks and pores compared to conventional compact silicon.

For most applications, polycrystalline silicon rods have to be crushed into smaller chunks. Typically, the chunks are subsequently classified by size. A process for comminuting and sorting polysilicon is described, for example, in U.S. Pat. No. 8,074,905 B2. In general, it is immaterial here whether the polycrystalline silicon is in compact or brittle form.

The morphology of polycrystalline rods and of chunks obtained therefrom, however, has a strong influence on the performance of the product.

As mentioned above, compact rods show better yields in crystal pulling.

A porous and fissured morphology like that according to US 2010/219380 A1, in contrast, has adverse effects on the crystallization characteristics. This particularly affects the demanding CZ process, in which it has not been possible to date to use porous and fissured chunks owing to the economically unacceptable yields.

U.S. Pat. No. 7,939,173 B2 discloses a polysilicon rod which, in the radial cross section, has regions with different crystal structures, an inner structure comprising few acicular crystals, if any, and an outer structure comprising acicular crystals and microcrystals, with presence of a mixed zone in which there is a fluid transition from the inner structure to the outer structure. This polysilicon rod is intended for use in the FZ process. The production is effected by deposition of silicon from hydrogen-diluted chlorosilanes having a molar proportion of the chlorosilanes of not more than 30% on a filament rod of silicon at a rod temperature of 950 to 1090° C. at the start of deposition. To obtain the different crystal structures, the process parameters are altered in a fluid manner. The rod temperature is lowered and the amount of hydrogen injected reduced, such that the molar proportion of the chlorosilanes is increased to 35-60%.

The problem described gave rise to the objective of the present invention.

The aim was to provide polycrystalline silicon which is less expensive to produce than compact material but nevertheless exhibits good performance in CZ crystal pulling.

DESCRIPTION OF THE INVENTION

The object of the invention is achieved by a polycrystalline silicon rod having a diameter of at least 150 mm, comprising a core (A) having a porosity of 0 to less than 0.01 around a thin rod, and at least two subsequent regions B and C which differ in porosity by a factor of 1.7 to 23, the outer region C being less porous than region B.

Core A preferably extends over a diameter region of up to 60 mm. The thin rod on which core A is deposited typically has an extent of a few mm up to 12 mm. Thus, core A typically starts, for example, at a diameter of 9 mm and extends up to a diameter of not more than 60 mm. Core A preferably extends up to a diameter of not more than 50 mm, more preferably not more than 40 mm.

Preferably, region B which follows core A has the greatest porosity of 0.06 to 0.23 and extends over a diameter region of 15% to 90% of the diameter of the silicon rod. Region B preferably extends over a diameter region of 20-80%.

In the case of a diameter of the silicon rod of 150 mm, region B preferably extends over a region of a diameter of at least 22 mm up to a diameter of not more than 145 mm, more preferably over a region of 45-120 mm.

In the case of a diameter of the silicon rod of 200 mm, region B preferably extends over a region of a diameter of at least 30 mm up to a diameter of not more than 180 mm, more preferably over a region of 40-160 mm.

The subsequent region C preferably has a lower porosity of 0.01 to 0.1 and extends over a diameter region of 50% to 100% of the total diameter of the silicon rod. Region C preferably extends over a diameter region of 60-100%, more preferably over a region of 70-100%.

In the case of a diameter of the silicon rod of 150 mm, region C preferably extends over a region of a diameter of at least 75 mm up to a diameter of not more than 150 mm, more preferably over a region of 90-150 mm, most preferably over a region of 105-150 mm.

In the case of a diameter of the silicon rod of 200 mm, region C preferably extends over a region of a diameter of at least 100 mm up to a diameter of not more than 200 mm, more preferably 120-200 mm, most preferably 140-200 mm.

The porosity in region C is preferably constant. It is especially preferable when the porosity in region C decreases with increasing diameter.

It is additionally preferable when a final layer Z applied to the porous regions B and C has a porosity of 0 to less than 0.01 (compact) within a diameter region of 90% to 100% of the total diameter. A particularly preferred diameter region is 95-100%.

In the case of a diameter of the silicon rod of 150 mm, layer Z preferably extends over a region of a diameter of at least 135 mm up to 150 mm.

In the case of a diameter of the silicon rod of 200 mm, layer Z preferably extends over a region of a diameter of at least 180 mm up to 200 mm.

The Z layer preferably has a thickness of at least 7.5 mm.

Particularly in the case of relatively low diameters, layer Z is advantageous when layer C is not very thick, such that a very compact final layer smooths the surface.

A region of the silicon rod having a porosity of less than 0.01 is regarded as compact in the context of the invention. A region having a porosity of 0.01 to 0.1 is referred to as "impervious material" or "impervious layer". Region C comprises impervious material.

BRIEF DESCRIPTION OF THE DRAWINGS

The invention is also illustrated hereinafter by figures.

A shows the compact core region A around the thin rod. B represents the first porous layer, C the impervious layer. Z denotes the optional compact layer Z.

The extent of the regions B and C is defined as a function of the diameter D of the silicon rod.

The total diameter of the polycrystalline silicon rod is at least 150 mm.

The polycrystalline silicon rod preferably has a total diameter of at least 180 mm.

Particular preference is given to a polycrystalline silicon rod having a diameter of at least 200 mm.

Figure 1:
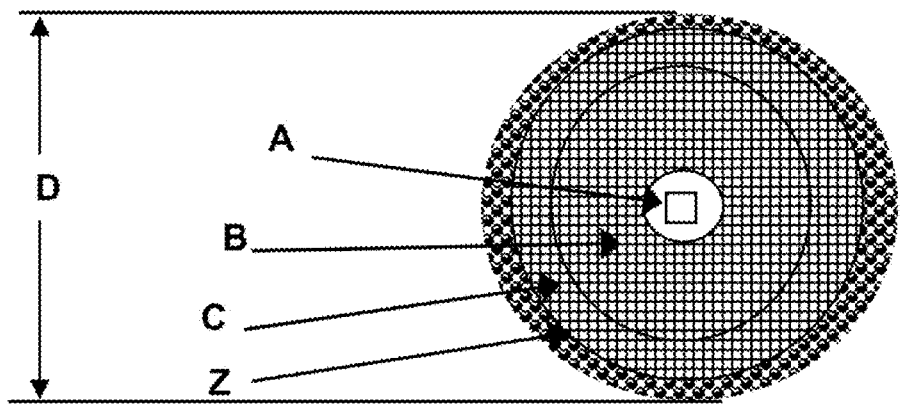
FIG. 1 shows a schematic of the structure of an inventive silicon rod which additionally comprises a Z layer.
Figure 2:
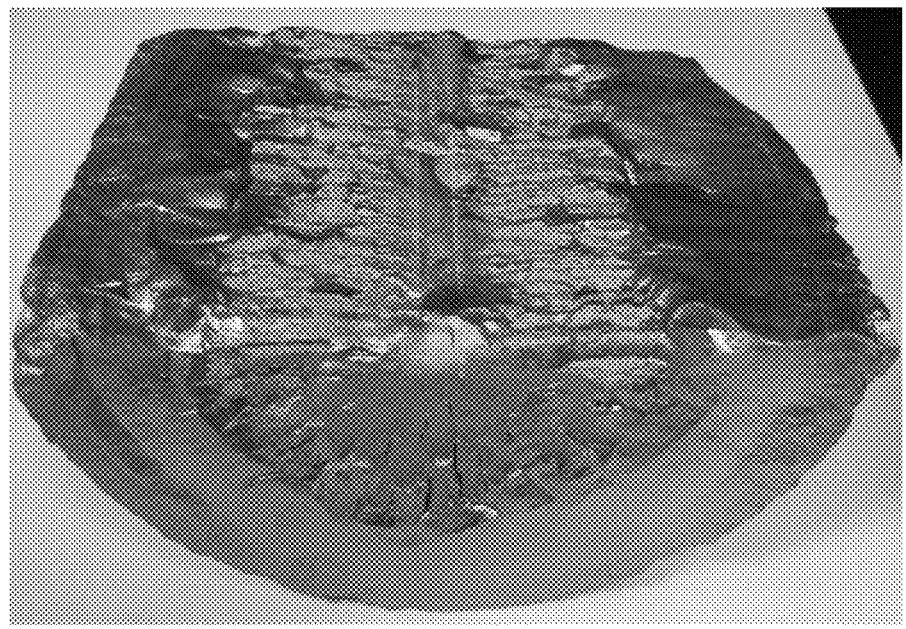
FIG. 2 shows a photograph of a crushed silicon rod.

In FIG. 2, a compact core, a porous region and a compact outer region are identifiable.

By comminuting the inventive polycrystalline silicon rod, it is possible to produce polycrystalline silicon chunks.

The comminution of the rods is preferably effected analogously to EP 2 423 163 A1 with subsequent dust removal from the chunks by means of compressed air or dry ice.

It is equally preferred, analogously to U.S. Pat. No. 8,074,905, to crush the rods into chunks, to classify or to sort them into chunks of size class from about 0.5 mm to greater than 45 mm, and then to subject them to a wet-chemical purification—as described in EP 0 905 796 B1.

It is a feature of the amount of polycrystalline silicon chunks obtained that it includes chunks with different porosities and chunks which comprise regions with different porosities.

Additionally present are chunks comprising an outer face having a radius of curvature of at least 75 mm.

The porosities of individual chunks vary preferably from 0 to 0.25.

Individual chunks have a porosity of 0 to less than 0.01 and originate from the compact core of the silicon rod or from the optionally present Z layer.

Other chunks are more or less porous and have porosities of 0.01 to 0.25.

Preference is given to the presence of chunks comprising an outer face having a radius of curvature of at least 90 mm.

Particular preference is given to the presence of chunks comprising an outer face having a radius of curvature of at least 100 mm.

The overall porosity of a sample is composed of the sum total of the cavities which are connected to one another and to the environment, and the cavities which are not connected to one another. The overall porosity, i.e. the proportion of the total pore volume (open and closed pores) in the total volume of the polysilicon is determined to DIN-EN 1936 from the calculation of apparent and true density, i.e. overall porosity=1−(apparent density/2.329 [g/cm$^3$]).

The apparent density is defined as the density of the polysilicon including the pore space in the dry state to DIN-EN 1936 (weighing of test specimens of defined volume or measurement of the buoyancy of the saturated sample in mercury with a hydrostatic balance).

The compact core A of the polycrystalline silicon rod preferably has an apparent density of 2.329 (porosity 0).

Region B preferably has an apparent density of 1.8 to 2.2.

Region C preferably has an apparent density of 2.1 to 2.3.

Layer Z preferably has an apparent density of 2.25 to 2.329.

The object of the invention is also achieved by a process for producing polycrystalline silicon rods by introducing a reaction gas comprising a silicon-containing component into a reactor, as a result of which polycrystalline silicon is deposited on thin rods up to a target rod diameter, which comprises (a) in a first step, depositing a core (A) having a porosity of 0 to less than 0.01 onto each of the thin rods up to a rod diameter of 15-60 mm, the rod temperature being 1000° C. to 1150° C., the concentration of the silicon-containing component in the reaction gas being 20 to 60 mol % and the feed rate of the silicon-containing component being 100 to 550 kg/h per 1 m$^2$ of rod surface area;

(b) in a second step, beginning at a rod diameter of at least 10% up to a rod diameter of at most 90% of the target rod diameter, depositing a layer (B) having a porosity of 0.06 to 0.23 onto core (A), the rod temperature being 1030° C. to 1130° C., the concentration of the silicon-containing component in the reaction gas being 20 to 40 mol % and the feed rate of the silicon-containing component being 80 to 200 kg/h per 1 m$^2$ of rod surface area;

(c) and, in a third step, beginning at a rod diameter of at least 50% up to a rod diameter of at most 100% of the target rod diameter, depositing a layer (C) having a porosity of 0.01 to 0.1 onto layer (B), the rod temperature being 960° C. to 1030° C. and being at least 20° C. lower than the rod temperature during the second step, the concentration of the silicon-containing component in the reaction gas being 15 to 35 mol %, and the feed rate of the silicon-containing component being 10 to 130 kg/h per 1 m$^2$ of rod surface area.

Preference is given to effecting a fourth step, beginning at a rod diameter of at least 90% up to a rod diameter of at most 100% of the target rod diameter, in which a layer (Z) having a porosity of 0 to 0.01 is deposited onto layer (C), the rod temperature being 930° C. to 1000° C. and being at least 20° C. lower than the rod temperature during the third step, the concentration of the silicon-containing component in the reaction gas being 3 to 30 mol %, and the feed rate of the silicon-containing component being 6 to 60 kg/h per 1 m$^2$ of rod surface area.

The target rod diameter is preferably at least 150 mm, more preferably at least 180 mm and most preferably at least 200 mm.

The porosities of the regions deposited are controlled by a suitable selection of rod temperature and concentration of the silicon-containing component.

The feed rate of the silicon-containing component is preferably reduced in the course of the process. Preference is given to reducing the feed rate of the silicon-containing component in each of the individual process steps within the limits claimed.

Preference is given to increasing the concentration of the silicon-containing component during step a). In step b) up to the end of the process, the concentration of the silicon-containing component is preferably lowered continuously.

The transitions between the individual process steps are preferably fluid. There are preferably no abrupt transitions. Process conditions at the start of a process step correspond to the process conditions at the end of the preceding process step.

The silicon-containing component is preferably a chlorosilane. Preference is given to using hydrogen as the carrier gas.

Particular preference is given to the use of trichlorosilane.

The concentration of the chlorosilane in the hydrogen carrier gas is regulated by the feed rate of chlorosilane and the feed rate of hydrogen.

Preference is given to continuously reducing the feed rate of hydrogen in the course of the process. Preference is given to reducing the feed rate of hydrogen in each of the individual process steps.

In the course of performance of the process, process parameters have to be monitored. This is preferably effected as follows:

Gas flow rates are determined with commercial meters. The H$_2$ flow rate is measured by means of a volume flow rate meter (for example an impeller meter).

The flow rate of the chlorosilanes is determined by means of mass flow rate meters.

The temperature is measured with a commercial radiation pyrometer which measures the surface temperature of the closest rod at a rod height of about 1 meter.

The rod diameter is monitored with an optical measurement method (for example spyglass with calibrated division scale, camera, etc.) which measures the diameter of a rod or determines the diameter from the rod separations at a rod height of about 1 meter.

The inventive polycrystalline silicon rod comprises an innermost layer or a core region A around the thin rod which has been deposited rapidly and is compact, i.e. by definition has a porosity of less than 0.01. In the deposition of the compact region, a comparatively low temperature and a high gas pulse flow rate are selected (gas pulse flow rate=mass flow rate*exit velocity at the nozzle).

The core region is followed by a first porous region B having a porosity of 0.06 to 0.23. This too has been deposited rapidly. This region B comprises, for example, holes, gaps and fissures. The porosity is determined essentially by temperature and gas flow rate.

The first porous region B is followed by a second porous region C which has a much lower porosity of 0.01 to 0.1 than region B. The rod temperature during the production of region C is lower. Accordingly, this region C has been deposited more slowly than region B. Region C closes holes and scars. The surface is preferably flattened out.

The polycrystalline silicon rod preferably comprises a final layer to finish the surface of the silicon rod and to bring about additional smoothing of the surface. This layer is compact.

The advantages of the invention lie particularly in a more favorable production process, especially since the predominant regions of the silicon rod (core A and region B) are deposited rapidly. For instance, the deposition rates (diameter growth) for core A are preferably 1.5 to a maximum of 2 mm/h, and, for region B, 1.8 to less than 2.2 mm/h.

The disadvantages which are otherwise possessed by porous material and which are manifested particularly in poor performance in the course of crystal pulling are avoided by surface finishing by slower deposition of not very porous or compact outer regions. For instance, the deposition rates (diameter growth) for region C are preferably 1 to less than 1.5 mm/h, and, for layer Z, 0.7 to less than 1.1 mm/h.

The production process is particularly economically viable since it is associated with lower throughputs of reactant material and lower energy consumption. Process disruption resulting from cracks, splinters and plant shutdowns does not occur.

The polycrystalline silicon rod shows a high yield in crystal pulling.

For instance, a mean dislocation-free rod length corresponding to that of compact deposited silicon is achievable.

The invention is illustrated in detail by examples.

It should be mentioned that the process parameters to be selected depend on the reactor type selected. More particularly, the number of rods, the separation of the electrodes and the nozzle diameter influence the process conditions. The examples which follow relate to an 8-rod reactor. In the case of larger reactors, for example a 48-rod reactor, the process parameters should be adjusted. On the basis of a few exploratory experiments, it is possible for the person skilled in the art to apply the concept of the invention to all possible types of Siemens reactors.

In the case of use of alternative silicon-containing components too—the examples relate to deposition with trichlorosilane and hydrogen as the carrier gas corresponding adjustments should be undertaken by the person skilled in the art.

EXAMPLES

Comparative Example

For the comparative example, a deposition plant having 8 rods and having an electrode separation of 270 mm was used. The total rod length (with bridges) was 20 280 mm.

The nozzle diameter was 16 mm. The reaction gas used was a mixture of trichlorosilane and hydrogen.

Table 1 shows the process parameters selected for the comparative example. Two regions A and B were deposited. D in mm indicates the growing diameter of the silicon rod. T denotes the rod temperature in ° C. Also reported are the feed rate of hydrogen and trichlorosilane and the concentration of trichlorosilane in mol %.

TABLE 1

| Region | D [mm] | T [° C.] | $H_2$ [m$^3$ (STP)/h/m$^2$] | TCS [kg/h/m$^2$] | Conc. [mol %] |
|---|---|---|---|---|---|
| A | 9 | 1070 | 184 | 368 | 25 |
| A | 58 | 1070 | 51 | 150 | 33 |
| B | 68 | 1080 | 41 | 144 | 36 |
| B | 100 | 1080 | 40 | 130 | 35 |
| B | 130 | 1080 | 36 | 108 | 33 |
| B | 160 | 1068 | 28 | 80 | 32 |
| B | 180 | 1056 | 24 | 66 | 31 |

Region A (core region) extended up to diameter 58 mm and was deposited with a temperature of 1070° C.

The amount of chlorosilane per unit silicon area was 368 to 150 kg/h/m$^2$ with a molar concentration in the carrier gas ($H_2$) of 25 to 33%.

The core region exhibited compact morphology without holes or inclusions. The porosity was less than 0.01.

Between 58 mm and 68 mm, there is a fluid transition from region A to region B.

Region B followed on from layer A with a diameter of 68 to 180 mm at a temperature of 1080° C. to 1056° C.

The amount of chlorosilane per unit silicon area was 144 to 66 kg/h/m$^2$ with a molar concentration in the carrier gas ($H_2$) of 36 to 31%.

Region B showed a highly porous morphology with holes and gaps. The porosity was 0.13.

The above-described rods were, as described in EP 2 423 163 A1, crushed into chunks, sorted into chunks of size class from about 0.5 mm to greater than 45 mm, and treated by means of compressed air in order to remove silicon dust from the chunks. There was no chemical wet cleaning of the chunks.

The surface metal contamination in the polycrystalline silicon and the size distribution of the individual chunk fractions corresponded to the values reported in EP 2 423 163 A1.

Owing to the different porosity of the rod, chunks with different porosities were present.

A sample comprising 20 chunks of different size was selected randomly and analyzed for porosity and (if present) with regard to the radius of curvature of the outer face thereof.

The result of the measurements is shown in Table 2.

The polysilicon chunks from the comparative example were also examined with respect to the performance thereof in crystal pulling.

For 20 rods produced according to the comparative example, a mean dislocation-free length of 84% was found.

The dislocation-free length is defined from dislocation-free rod length with respect to the maximum possible cylindrical utilizable rod length.

TABLE 2

| Chunk | Mass [g] | Porosity | Radius of curvature of the outer face (if present) [mm] |
|---|---|---|---|
| #1 | 92.6 | 0.11 | — |
| #2 | 199.3 | 0.16 | — |
| #3 | 208.0 | 0.10 | — |
| #4 | 94.7 | 0.11 | — |
| #5 | 166.4 | 0.19 | 89.1 |
| #6 | 206.0 | 0.20 | 90.25 |
| #7 | 104.6 | 0.10 | — |
| #8 | 170.0 | 0.12 | — |
| #9 | 78.0 | 0.01 | — |
| #10 | 163.0 | 0.06 | — |
| #11 | 201.2 | 0.16 | 89.5 |
| #12 | 207.6 | 0.09 | — |
| #13 | 120.1 | 0.07 | — |

TABLE 2-continued

| Chunk | Mass [g] | Porosity | Radius of curvature of the outer face (if present) [mm] |
|---|---|---|---|
| #14 | 97.7 | 0.00 | — |
| #15 | 172.5 | 0.16 | — |
| #16 | 187.5 | 0.13 | — |
| #17 | 104.2 | 0.09 | — |
| #18 | 157.1 | 0.09 | — |
| #19 | 163.4 | 0.21 | 90.95 |
| #20 | 159.0 | 0.09 | — |

Example 1

For the first inventive example, a deposition plant as specified in the comparative example was likewise utilized.

As in the comparative example, deposition was effected with trichlorosilane and hydrogen.

In a departure from the comparative example, in accordance with the invention, an additional region C (less porous than B) and an optional Z layer (compact) were deposited.

Table 3 shows the process parameters used.

TABLE 3

| Region | D [mm] | T [° C.] | $H_2$ [m$^3$ (STP)/ h/m$^2$] | TCS [kg/ h/m$^2$] | Conc. [mol %] |
|---|---|---|---|---|---|
| A | 9 | 1070 | 184 | 368 | 25 |
| A | 58 | 1070 | 51 | 150 | 33 |
| B | 68 | 1080 | 41 | 144 | 36 |
| B | 100 | 1080 | 40 | 119 | 33 |
| B | 121 | 1080 | 37 | 116 | 34 |
| C | 132 | 1010 | 35 | 107 | 33 |
| C | 150 | 1010 | 31 | 87 | 32 |
| C | 165 | 1010 | 30 | 66 | 27 |
| Z | 167 | 980 | 32 | 60 | 24 |
| Z | 173 | 980 | 37 | 47 | 17 |
| Z | 178 | 980 | 38 | 43 | 15 |

Region A extended up to diameter 58 mm and was deposited with a temperature of 1070° C.

The amount of chlorosilane per unit silicon area was 368 to 150 kg/h/m$^2$ with a molar concentration in the carrier gas ($H_2$) of 25 to 33%.

Region A had a compact morphology without holes and inclusions. The porosity was less than 0.01.

Between 58 mm and 68 mm, there is a fluid transition from region A to region B.

Region B followed on from region A over a diameter of 68 to 121 mm at a temperature of 1080° C.

The amount of chlorosilane per unit silicon area was 144 to 116 kg/h/m$^2$ with a molar concentration in the carrier gas ($H_2$) of 36 to 34%.

Region B had a highly porous morphology with holes and gaps. The porosity was 0.11.

Between 121 mm and 132 mm, there is a fluid transition from region B to region C.

Region C runs over a diameter region from 132 mm up to 165 mm.

The temperature for this was 1010° C.

The amount of chlorosilane per unit silicon area was 107 to 66 kg/h/m$^2$ with a molar concentration in the carrier gas ($H_2$) of 33 to 27%.

Region C had a compact morphology with few holes and gaps. The porosity was 0.05.

Between 165 mm and 167 mm, there is a fluid transition from region C to layer Z.

Layer Z is the outermost layer, which extends from a diameter of greater than 167 mm up to the target rod diameter of 178 mm.

The rod temperature in the course of deposition of layer Z was 980° C.

The amount of chlorosilane per unit silicon area was 60 to 43 kg/h/m$^2$ with a molar concentration in the carrier gas ($H_2$) of 24 to 15%.

Z had a very compact morphology without visible holes and gaps. The porosity was 0.01.

The rods produced in example 1 were crushed, sorted and dedusted as in the comparative example, analogously to EP 2 423 163 A1.

A sample comprising 20 chunks of different size was selected randomly and analyzed with regard to porosity and (if present) radius of curvature of the outer face.

Table 4 shows the results of these measurements.

For some chunks, it was possible to determine the radius of curvature of the outer face thereof. This allows conclusion of the diameter of the polycrystalline silicon rod (here: 180 mm).

The porosities of the chunks are in the range from 0 (compact) up to 0.18 (highly porous from region B).

The polysilicon chunks from example 1 were also examined with regard to the performance thereof in crystal pulling.

For 20 rods obtained according to example 1, a mean dislocation-free length of 98% was found.

TABLE 4

| Chunk | Mass [g] | Porosity | Radius of curvature of the outer face (if present) [mm] |
|---|---|---|---|
| #1 | 215.7 | 0.01 | 89.6 |
| #2 | 49.9 | 0.02 | — |
| #3 | 17.3 | 0.03 | — |
| #4 | 102.7 | 0.00 | 88.1 |
| #5 | 114.4 | 0.05 | — |
| #6 | 217.9 | 0.11 | — |
| #7 | 150.2 | 0.12 | — |
| #8 | 160.7 | 0.03 | — |
| #9 | 22.1 | 0.00 | 89.4 |
| #10 | 35.0 | 0.05 | — |
| #11 | 156.2 | 0.10 | — |
| #12 | 120.4 | 0.01 | 88.7 |
| #13 | 80.5 | 0.08 | — |
| #14 | 11.3 | 0.02 | 88.2 |
| #15 | 173.7 | 0.00 | 88.0 |
| #16 | 193.6 | 0.11 | — |
| #17 | 11.0 | 0.09 | — |
| #18 | 189.3 | 0.13 | — |
| #19 | 37.1 | 0.18 | — |
| #20 | 67.0 | 0.01 | 89.5 |

Example 2

For the second inventive example, a deposition plant as specified in the comparative example was likewise utilized. As in the comparative example, deposition was effected with trichlorosilane and hydrogen.

Table 5 shows the process conditions.

TABLE 5

| Layer | D [mm] | T [° C.] | $H_2$ [m$^3$ (STP)/ h/m$^2$] | TCS [kg/ h/m$^2$] | Conc. [mol %] |
|---|---|---|---|---|---|
| A | 9 | 1070 | 184 | 368 | 25 |
| A | 58 | 1070 | 51 | 150 | 33 |
| B | 68 | 1080 | 41 | 144 | 36 |
| B | 100 | 1080 | 40 | 119 | 33 |

TABLE 5-continued

| Layer | D [mm] | T [° C.] | $H_2$ [m³ (STP)/ h/m²] | TCS [kg/ h/m²] | Conc. [mol %] |
|---|---|---|---|---|---|
| B | 132 | 1080 | 35 | 107 | 33 |
| C | 141 | 1010 | 33 | 97 | 33 |
| C | 201 | 1010 | 20 | 49 | 29 |

In contrast to example 1, no external, very compact layer Z was deposited here.

Core region A extended up to diameter 58 mm and was deposited with a temperature of 1070° C.

The amount of chlorosilane per unit silicon area was 368 to 150 kg/h/m² with a molar concentration in the carrier gas ($H_2$) of 25 to 33%.

The morphology of core region A was compact without holes and inclusions. The porosity is less than 0.01.

Between 58 mm and 68 mm, there is a fluid transition from region A to region B.

Region B followed on from layer A with a diameter of 68 to 132 mm at a temperature of 1080° C.

The amount of chlorosilane per unit silicon area was 107 to 144 kg/h/m² with a molar concentration in the carrier gas ($H_2$) of 33 to 36%.

The morphology of region B was highly porous with holes and gaps. The porosity was 0.11.

Between 132 mm and 141 mm, there is a fluid transition from region B to region C.

Region C is the final layer with a diameter of greater than or equal to 141 mm up to the target rod diameter of 201 mm.

The temperature for this was 1010° C.

The amount of chlorosilane per unit silicon area was 55 to 97 kg/h/m² with a molar concentration in the carrier gas ($H_2$) of 30 to 33%.

The morphology of region C is compact, with few holes and gaps. The porosity was 0.03.

The silicon rods produced were—as described, for example, in U.S. Pat. No. 8,074,905—crushed into chunks and sorted into chunks of size class from about 0.5 mm to greater than 45 mm. They were subsequently subjected to a wet-chemical cleaning operation as described in EP 0 905 796 B1.

This gives surface metal concentrations as described in.

A sample comprising 20 chunks of different size was selected randomly and analyzed with regard to porosity and (if present) radius of curvature of the outer face.

Table 6 shows the results of these measurements.

For some chunks, it was possible to determine the radius of curvature of the outer face thereof. This allows conclusion of the diameter of the polycrystalline silicon rod (here: 201 mm).

The porosities of the chunks are in the range from 0.01 (not very porous) up to 0.15 (highly porous from region B).

The polysilicon chunks from example 2 were also examined with regard to the performance thereof in crystal pulling.

For 20 rods obtained according to example 2, a mean dislocation-free length of 97% was found.

TABLE 6

| Chunk | Mass [g] | Porosity | Radius of curvature of the outer face [mm] |
|---|---|---|---|
| #1 | 86.2 | 0.02 | 102.9 |
| #2 | 92.4 | 0.08 | — |
| #3 | 138.6 | 0.10 | — |
| #4 | 137.8 | 0.01 | 101.1 |
| #5 | 235.9 | 0.02 | 103.0 |
| #6 | 236.8 | 0.02 | — |
| #7 | 223.7 | 0.08 | — |
| #8 | 208.9 | 0.09 | — |
| #9 | 195.2 | 0.01 | — |
| #10 | 178.4 | 0.02 | — |
| #11 | 40.9 | 0.01 | 102.8 |
| #12 | 118.9 | 0.14 | — |
| #13 | 182.1 | 0.15 | — |
| #14 | 230.2 | 0.13 | — |
| #15 | 59.4 | 0.09 | — |
| #16 | 135.8 | 0.02 | 97.7 |
| #17 | 54.7 | 0.10 | — |
| #18 | 224.0 | 0.00 | 97.8 |
| #19 | 64.0 | 0.02 | 104.7 |
| #20 | 224.5 | 0.09 | — |

What is claimed is:

1. A polycrystalline silicon rod having a total diameter of at least 150 mm, comprising:
   a core A having a porosity of 0 to less than 0.01, which is around a thin rod;
   a region B around core A; and
   a region C around region B,
   wherein regions B and C differ in porosity by a factor of 1.7 to 23, and region C is less porous than region B.

2. The polycrystalline silicon rod as claimed in claim 1, wherein core A extends up to a diameter of not more than 60 mm.

3. The polycrystalline silicon rod as claimed in claim 1, wherein region B has a porosity of 0.06 to 0.23 and extends over a region of 15% of the total diameter to a maximum of 90% of the total diameter.

4. The polycrystalline silicon rod as claimed in claim 1, wherein region C has a porosity of 0.01 to 0.1 and extends over a region of at least 50% of the total diameter to a maximum of 100% of the total diameter, region C having a lower porosity than region B.

5. The polycrystalline silicon rod as claimed in claim 1, further comprising a layer Z around region C, which has a porosity of 0 to less than 0.01 and extends over a region of at least 90% of the total diameter to 100% of the total diameter.

6. The polycrystalline silicon rod as claimed in claim 2, wherein region B has a porosity of 0.06 to 0.23 and extends over a region of 15% of the total diameter to a maximum of 90% of the total diameter.

7. The polycrystalline silicon rod as claimed in claim 6, wherein region C has a porosity of 0.01 to 0.1 and extends over a region of at least 50% of the total diameter to a maximum of 100% of the total diameter, region C having a lower porosity than region B.

8. The polycrystalline silicon rod as claimed in claim 7, further comprising a layer Z around region C, which has a porosity of 0 to less than 0.01 and extends over a region of at least 90% of the total diameter to 100% of the total diameter.

* * * * *